United States Patent [19]

Duthoit

[11] Patent Number: 4,812,759
[45] Date of Patent: Mar. 14, 1989

[54] METHOD FOR MEASURING AND CORRECTING THE INDUCED MAGNETIZATION IN A NAUTICAL VESSEL

[75] Inventor: François Duthoit, Brest, France

[73] Assignee: Thomson-CSF, Paris, France

[21] Appl. No.: 872,839

[22] Filed: Jun. 11, 1986

[30] Foreign Application Priority Data

Jun. 14, 1985 [FR] France ................................. 85 09071

[51] Int. Cl.[4] ..................... G01N 27/72; G01R 33/02; H01F 13/00; H01H 47/00

[52] U.S. Cl. .................................... 324/226; 324/244; 361/149

[58] Field of Search ............... 324/225, 226, 244, 260, 324/262; 361/143, 149, 267; 114/15, 240 R

[56] References Cited

U.S. PATENT DOCUMENTS 3,215,904 11/1965 Bart ....................... 361/149

4,292,590 9/1981 Wilson ............................... 324/226

Primary Examiner—Reinhard J. Eisenzopf
Assistant Examiner—Walter E. Snow
Attorney, Agent, or Firm—Oblon, Fisher, Spivak, Mc Clelland & Maier

[57] ABSTRACT

The invention concerns processes for immunizing nautical vessels against the disturbances that they cause to the magnetic field of the earth, consisting in supplying immunization loops of such a vessel with a set of alternating currents producing inside the volume of the vessel a homogeneous and alternating inductor field, isolating the alternating signal issuing from the alternating field at the measuring base and calculating the induced magnetization, wherein it allows to separate the induced magnetization from the permanent magnetization in the magnetic signature of a vessel while reducing the duration of measuring time required.

13 Claims, 2 Drawing Sheets

FIG_1
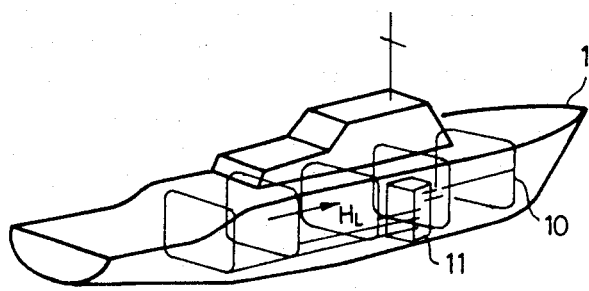
FIG_2
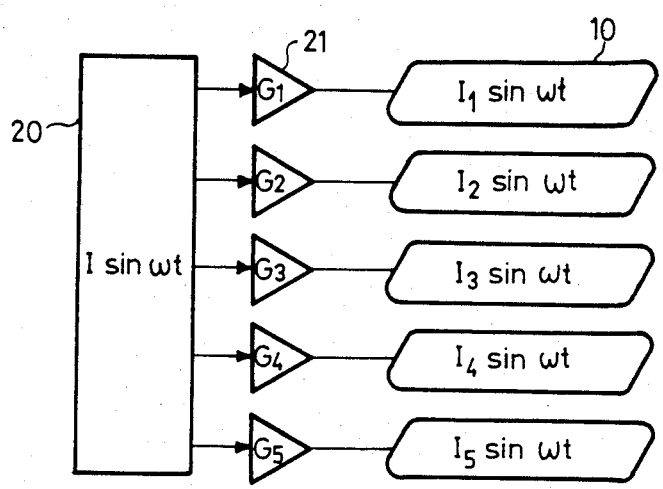
FIG_4
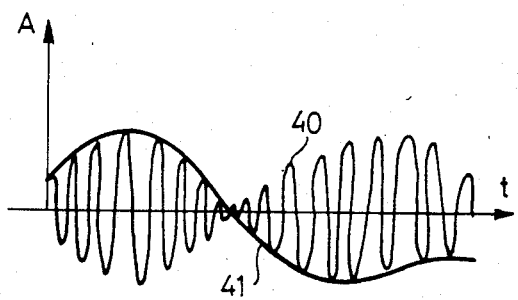

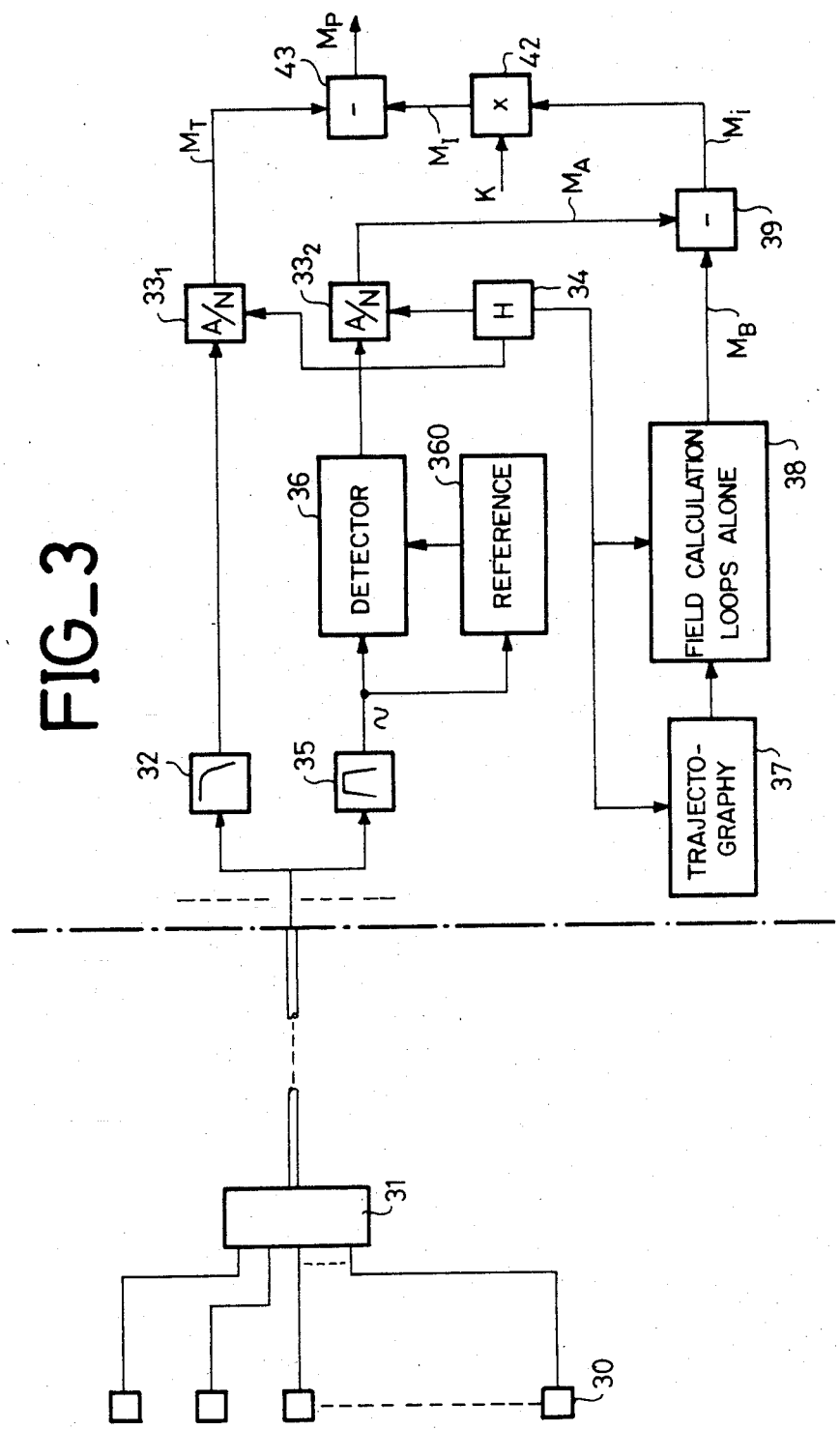

METHOD FOR MEASURING AND CORRECTING THE INDUCED MAGNETIZATION IN A NAUTICAL VESSEL

BACKGROUND OF THE INVENTION

1. Field of the invention

The present invention concerns processes that allow measuring the induced magnetization in a nautical vessel in order to be able to thereafter carry out a process for the magnetic immunization of said vessels. It also concerns devices that allow this process to be carried out.

2. Summary of the prior art

At the present time, most nautical vessels, boats and submarines are built from steel or iron and thus have a high magnetization. This magnetization comprises, on the one hand, a permanent proportion that is specific to vessels and, on the other hand, a variable proportion induced by the magnetic field of the earth and which thus depends upon the position of the vessel with respect to the magnetic-field of the earth.

This magnetization of the vessel is superimposed upon a magnetic field of the earth and thus generates a disturbance called the "magnetic signature" of the vessel. This disturbance allows for the location of the vessel to be and determined thereby making it possible to guide or fire missiles intended to destroy it. It is therefore extremely important to minimize, or even suppress, this disturbance in order to avoid the vessel detected by a magnetic method.

This operation, called "magnetic immunization", is performed in a manner known per se by creating in the volume of the vessel a magnetic field that is opposed to that of the vessel in order to cancel the magnetic signature.

To do this, the vessel is fitted with an assembly of circuits known as "immunization loops" through which pass electric currents. The sizes and the disposition of the loops, and the intensity of the currents that pass through them, are determined so as to fully minimize the magnetic signature of the vessel, whatever its orientation in the magnetic field of the earth, i.e. whatever its head and its list due to rolling and to pitching. These immunization loops are distributed throughout three assemblies corresponding to the axes of roll, pitch and rocking, and conventionally called "L, M, A".

To determine the intensities of the currents that will pass through the immunization loops, it is necessary to measure the magnetic signature of the vessel and for this purpose a magnetic measuring station is used.

A magnetic measuring station advantageously comprises two linear networks of magnetic sensors, called bases, placed on the sea-bed and each aligned according to a cardinal direction, N/S for one, and E/W for the other. These sensors are connected to a land-based processing unit which receives the signals produced by the passage of the vessel to be immunized above the bases according to trajectories which are preferably themselves cardinal. These signals are processed in the station to determine the intensity and the polarity of the currents in the immunization loops in such a way as to obtain satisfactory immunization, whatever the orientation of the vessel in the magnetic field of the earth.

Since the permanent magnetization is steady with respect to the vessel in direction and amplitude and only evolves very slowly as a function of time, it is possible to determine a continuous component of the current in each loop, the value of which will be set and possibly reset during a subsequent immunization operation.

On the other hand, the induced magnetization is variable and it is necessary to superimpose upon this continuous component a variable component determined according to the heading and the orientation of the vessel which are known by measuring means, such as gyroscopic or optical means, for example.

To determine respectively these continuous components and variable components, it is necessary, when measuring the magnetic signature to separate the influences of the permanent magnetization from those of the induced magnetization in the total magnetization, and this separation must be made in the three directions corresponding to the three axes of the vessel.

To do this, the vessel is usually required to travel along the same route twice above the bases according to opposite headings. The vessel thus passes in a N/S direction above the E/W base and then S/N above this same base. It thereafter passes in E/W direction above the N/S base and returns in a W/E direction above said same base. The orientation of the bases and the routes is not compulsory but it facilitates the interpretions measurements and calculations.

During these opposite passages, the permanent magnetization, which is associated to the vessel, turns with the vessel while the induced magnetization does not turn. In order to determine this induced magnetization, it is thus sufficient to subtract the two measurements corresponding to two passages in opposite directions. Once the induced magnetization and the total magnetization are known, the permanent magnetization is directly obtained.

The fact of having to complete two successive passages according to opposite heads is in itself a drawback, especially since it lengthens the duration of operations. Furthermore, it is necessary to set back the measurements, for example by interpolation, so as to perform subtraction on homologue points for both passages. Indeed, an inevitable variation exists between the routes in one direction and in the other. Since, furthermore, the trajectory measurements themselves are inaccurate, it can be seen that sources of errors accumulate.

Similarly, this method is limited to longitudinal and transversal magnetization, since it is obviously not possible to set the vessel vertical in order to separate the induced magnetization from the permanent magnetization according to the vertical direction. In this latter case, the two magnetizations are separated according to empirical methods based on the experience of the operators and measurements on models that are roughly representative of the vessel.

In order to overcome these drawbacks, the invention proposes to create in the vessel a supplementary known magnetic field that allows to generate a supplementary induced magnetization, the resulting magnetic field of which can be easily separated from that due to the magnetization of the magnetic field of the earth. This supplementary magnetic field is calculated so as to be geometrically as close as possible to that of the magnetic field of the earth in the vessel. It is obtained by means of alternating currents injected into the immunization loops. The magnetic field produced by the loops along with respect to the sensors can be calculated, thereby allowing to obtain by subtraction from the alternating magnetic field measured by the sensors of the immunization base the magnetic field due to the induced field in the vessel.

BRIEF DESCRIPTION OF THE DRAWINGS

Other features, objects and advantages of the present invention will become apparent from the following description given by way of non-limitative example with reference to the appended figures in which:

FIG. 1 is a schematic view of a vessel fitted with immunization loops;

FIG. 2 is a power supply diagram of these loops;

FIG. 3 is a diagram of the measuring system;

FIG. 4 is the diagram of the signals representing the variation of the induced magnetization with the displacement of the vessel.

DESCRIPTION OF A PREFERRED EMBODIMENT

For enhanced understanding, the following description concerns the longitudinal axis of the vessel, but the process is identical for the transversal axis and the vertical axis, the invention being particularly useful for said latter axis.

The surface vessel 1 represented on FIG. 1 is for example fitted with five immunization (L) loops 10 allowing to compensate the longitudinal magnetization. The sizing and the positioning of these loops has been determined, a priori, by empirical processes based on previous experience and which are generally sufficient, the accuracy of the immunization system relying mainly upon the precise determination of the currents caused to circulate in these loops. They produce a longitudinal field $H_L$ the field lines of which are similar to those of a solenoide.

According to the invention, it is necessary to cause to pass through the loops on alternating current producing a magnetic field which is, without taking into account the magnetic influence of the vessel, as close as possible to the magnetic field, of the earth, i.e. the most homogenous possible. Such a field can be accurately calculated by applying the laws of electromagnetism, especially those of Biot and Savart. This field is thus calculated as a function of the difference currents in a group of points distributed throughout the volume of the vessel, especially at sites where the risk of strong induced magnetization is the highest, i.e. in places where the metal masses are the greatest. The currents in the loops are thus calculated in order to minimize the variations between the values of the field at these points and the value of a given field, by using, for example, the least error squares method.

According to the invention, vessel 1 comprises means 11 allowing to supply the loops 10 with alternate currents the intensities of which correspond to those thus calculated. These means comprise for example as on FIG. 2 an alternating current 2 with pulsation ω which supplies the loops 10 through the intermediary of an assembly of power amplifiers 21, the phases of which are identical and the gains G controlled to obtain the desired intensities.

The frequency of generator 20 is fairly low, several Hertz for example, so as to render negligible the current induced by mutual inductance between the loops, which can thus be considered as independent.

The amplitudes of the currents are selected to as to obtain on immerged sensors a magnetic field level which is sufficient for good detection, without, however exceeding the linear portion of the hysteresis cycle of the metallic parts of the vessel.

When the vessel passes above a base formed of magnetic sensors 30 represented on FIG. 3, the loops 10 being supplied from generator 20, said sensors deliver measuring signals comprising an alternating component superimposed upon a continuous component.

These signals are directed through the intermediary of a junction box 31 and a multi-conductor cable towards a measuring station located on land, of which on FIG. 3 only the circuits corresponding to the exploitation of the signals from a single sensor 30 have been represented. Furthermore, each sensor generally comprises three probes directed along three rectangular axes in order to measure the components of the magnetic field according to these said axes, and only the circuits corresponding to one of these probes have been represented. Similarly, each probe generally comprises a preamplifier and a low-pass filter.

The signal from a sensor is thus processed first of all in a first channel allowing to measure the continuous signature, i.e. that which would normally be measured in the absence of an alternating field. This comprises both the permanent part and the part induced by the magnetic field of the earth.

To do this, the signal is filtered in a low-pass filter 32 the peak limit frequency of which is lower than the frequency of the alternating field received. The direct signal thus obtained is digitized in an analog/numerical converter $33_1$ controlled by a clock 34.

The signal issuing from the sensor is also processed in a second channel allowing to isolate by means of a band-pass filter 35 the alternating signature produced by the alternating current passing in the loops 10. The alternating signal from the filter 35 is a Double-side Band signal which is detected in a detecting device 36 which delivers an envelope representing the total, on the one hand, of the signature due to the field induced in the vessel by the current passing in the loops 10, and, on the other hand, of the signature due to the field produced by the loops alone by use of the reference circuit 360 which is phase synchronized with the signal to be detected.

The signal delivered by the detecting device 36 is digitized in an analog/numerical converter $33_2$ controlled by a clock signal issuing from the circuit 34. The signal $M_A$ is thus obtained which represents the total of the alternating induced signature $M_i$ and of the signature of the loops along $M_B$.

This latter is obtained by calculating the magnetic field with respect to the sensors by means of a computer 38 synchronized by the clock circuit 34. This computer operates from data that it has stored and which includes the form of coils and the currents which pass through them, the position of the sensors and the position of the vessel with respect to the base 30, which are addressed to said computer by a known trajectography means 37 such as is disclosed in Raab, U.S. Pat. No. 4,314,251, themselves synchronized by the clock 34.

According to one alternative of the invention, these calculations are performed in advance for the route foreseen by the vessel and for the corresponding water level above the base, and stored in a suitable memory. Computer 38 only acts to set back, for example by interpolation, the values thus stored as a memory in function of the actual route followed by the vessel.

A subtractor 39 allows the substraction of the signal $M_B$, corresponding to the loops alone, from the signal $M_A$ which is corresponding to the alternating signal, and to supply the signal $M_i$ representing the induced signature corresponding to the current passing through the loops.

Once these currents have been determined to represent a homogenous magnetic field of known value, the coefficient K is known corresponding to the ratio between the value of the component of the magnetic field of earth according to the longitudinal direction involved, and the induced field due to the loops 10. A multiplier circuit 42 allows to multiply signal $M_i$ by this coefficient K in order to obtain the magnetic signature $M_I$ induced by the longitudinal component of the magnetic field of the earth.

Since, at the output of the converter $33_1$ thiere is a signal $M_T$ giving the value of the continuous magnetic signature, a subtractor 43 allows from $M_T$ and $M_I$ to obtain a signal $M_P$ representing the permanent magnetic signature of the vessel according to the longitudinal direction.

FIG. 4 represents the aspect of the signal representing the magnetic field prior to detection 40 and after detection 41 in the case where there is inversion of the polarity of the magnetic field.

By way of alternative of the invention, it is possible to memorize signals $M_A$ and $M_T$ and the trajectography data of the vessel. This allows to perform the calculations necessary for time-delay separation of the induced field from the permanent field and thus to be released from limitations due to calculating time.

In practice, an alternating current frequency in immunization loops of 6 Hertz associated to a filter band width 35 of 1 Hertz gives good results.

It is necessary to perform the separation of the induced magnetizations from the permanent magnetizations in three directions, in order to be able to determine the currents to be circulated in the loops M, L, A. To do this, the vessel can make three successive passages on a base, during which the alternating current is injected into respectively loops M, L, A. This allows to obtain vertical, longitudinal and transversal components of the induced magnetization.

By way of alternative of the invention, it is possible to supply simultaneously the loops M, L, A by alternating currents at three distinct frequencies according to these loops. These frequencies are selected so as to be easily separated by filtering, while being low enough to remain in the pass-band of the magnetic sensors. It is thus possible to separate the longitudinal, vertical and transversal components of the induced magnetization in a single passage above the base, but it is necessary to process the signal from each sensor in four channels, one for the direct signal and three for the three alternating signals corresponding to the three distinct frequencies.

Another technique consists in undoubling the sensors of the base, by using at each time simultaneously for a single direction, one sensor for detecting the direct signature and another for detecting the alternating signature. Under these conditions, the specialized sensor for detecting the alternating field could be sensitive to frequencies considerably higher than in the original version and the receiving conditions, mainly the signal/noise ratio, would be considerably improved.

I claim:

1. A method of measuring the induced magnetization in a nautical vessel which is provided with at least one assembly of immunization loops intended to have a current passing there thru which is intended to neutralize the magnetization of this vessel comprising:

circulating at least one group of alternating currents having the same frequency thru said immunization loops creating a determined homogenous alternate field;

passing said vessel above at least one measuring base which has at least one magnetic field sensor;

determining the magnetic signature of the vessel from signals supplied by the sensor;

detecting in the signal supplied by the sensor an alternating component having the frequency of the currents in the loops, this component constituting a measurement of the total of the determined homogenous alternate field and of the field induced by this field and determining the currents necessary to neutralize the magnetization of the vessel.

2. A method according to claim 1, further comprising:

detecting direct and alternating signals from the sensor at low frequency and supplying from said signals from the sensor, by way of low-pass filtering, a direct component corresponding to the permanent magnetization of the vessel;

separating and filtering by a band-pass filter an alternating component corresponding to the determined homogenous, alternate field and to the induced magnetization of the vessel.

3. A method according to claim 1, further comprising:

detecting in a first element of the sensor the direct signals, at low frequency below a peak limit frequency lower than a determined frequency, and detecting in a second element of the sensor alternating signals in a frequency band situated above aforementioned peak limit frequency and comprising the determined frequency, wherein the first element supplies a direct component corresponding to a permanent magnetization of the vessel and the second element supplies an alternating component corresponding to the determined homogenous alternate field and to the induced magnetization of the vessel.

4. A method according to claim 1, further comprising:

determining the trajectory of the vessel with respect to the sensor and subtracting the value of the determined homogenous alternate field at a predetermined level based upon the characteristics of the sensor.

5. A method according to claim 4, further comprising:

detecting an alternating component of the field and subtracting said detected alternating component of the field from the determined homogenous field calculated with respect to the sensor, thereby obtaining the value of the field which is due to a field induced by the field.

6. A method according to claim 5, wherein the value of the field obtained by said subtraction is multiplied by a proportionality coefficient K which is between the value of the magnetic field of the earth and the value of the homogenous field in order to obtain a magnetization induced by the magnetic field of the earth in the vessel.

7. A method according to claim 6, further comprising:

totaling the permanent magnetization of the vessel and the induced magnetization in order to obtain the magnetic signature of the vessel.

8. A method according to claim 7, wherein the vessel comprises:
   three assemblies of immunization loops oriented with respect to the vertical direction of the vessel, and wherein said vessel is passed three times successively above the said measuring base while supplying at each occasion a distinct assembly of said immunization loops, in order to determine successively the component of the induced magnetization corresponding to each of the three directions.

9. A method according to claim 7, wherein the vessel is provided with three assemblies of immunization loops corresponding to the longitudinal, transversal and vertical directions of the vessel, and
   supplying to each of these assemblies alternating current each having a distint frequency; and passing said vessel a single time above the base and wherein these three frequencies are separated in the signal issuing from a receiving station in order to determine simultaneously the three components of the induced magnetization according to the three directions of the vessel.

10. A method according to claim 9, wherein any signals that are measured and any trajectory data obtained is recorded and any calculations employed are deferred.

11. A process as in claim 10 in a nautical vessel wherein said process comprises:
   supplying at least one of the assemblies of immunization loops currents of a predetermined frequency.

12.- A vessel according to claim 11, wherein each magnetic field sensor is formed in two parts and comprises a part that is sensitive to the direct field and a part that is sensitive to the alternate field.

13. A measuring base wherein said base comprises:
   at least one sensor means having a sensor for measuring the magnetic field disturbed by a vessel wherein said vessel induces a magnetic field and wherein said sensor means further includes means for isolating, in the signals outputted from said sensor, an alternating component,
   synchronous detecting means for detecting a direct component, in order to determine the route followed by the vessel,
   means for determining an inductive field produced by currents flowing in said sensor,
   means of subtracting from a signal detected, a signal supplied by the means for determining the inductor field,
   means for multiplying the signal issuing from the subtraction means by a proportionality coefficient which has a value between the value of the inductor field and a magnetic field of the earth, and
   means for supplying a signal which is representative of the value of the induced magnetization caused by said vessel.

* * * * *